(12) United States Patent
Kim et al.

(10) Patent No.: US 6,875,956 B2
(45) Date of Patent: Apr. 5, 2005

(54) METHOD OF FORMING PHOTORESIST PATTERN USING HOT PLATE OVEN

(75) Inventors: Jin Soo Kim, Kyoungki-do (KR); Jae Chang Jung, Seoul (KR); Ki Soo Shin, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 119 days.

(21) Appl. No.: 10/320,075

(22) Filed: Dec. 16, 2002

(65) Prior Publication Data

US 2003/0113672 A1 Jun. 19, 2003

(30) Foreign Application Priority Data

Dec. 19, 2001 (KR) .......................................... 2001-81009

(51) Int. Cl.⁷ ............................. F27D 11/00; F26B 19/00
(52) U.S. Cl. ................. 219/385; 219/443.1; 392/416; 392/418; 430/311; 430/330; 118/724; 118/725
(58) Field of Search .................................. 430/311, 330; 118/724, 725; 392/416, 418; 219/385, 443.1

(56) References Cited

U.S. PATENT DOCUMENTS

| 5,395,781 | A | 3/1995 | Wilhoit |
| 6,246,030 | B1 * | 6/2001 | Matsuyama ................. 219/390 |
| 6,358,672 | B2 | 3/2002 | Jeoung et al. |

* cited by examiner

Primary Examiner—John A. McPherson
Assistant Examiner—Daborah Chacko-Davis
(74) Attorney, Agent, or Firm—Marshall, Gerstein & Borun LLP

(57) ABSTRACT

A hot plate oven used in a thermal process of forming an ultrafine photoresist pattern and a method of forming a pattern using the same. More particularly, a hot plate oven used to flow photoresist under the high pressure in the sealed oven during a resist flow process.

7 Claims, 8 Drawing Sheets

METHOD OF FORMING PHOTORESIST PATTERN USING HOT PLATE OVEN

BACKGROUND

1. Technical Field

A hot plate oven is used in a thermal process for forming an ultrafine photoresist pattern. More particularly, a hot plate oven is used to flow photoresist under high pressure in the sealed oven during a resist flow process.

2. Description of the Related Art

Resist flow is a processing technology for forming a fine pattern which exceeds the resolution of the exposing device.

The resist flow process has recently made remarkable developments and so that it is now used in mass production processes. The technology generally involves an exposure process and a development process. The process forms a first photoresist pattern having a resolution equal to that of the exposing device. The process also includes heating the first photoresist pattern to a temperature higher than the glass transition temperature of the photoresist. As a result, the first photoresist pattern is flowed by the supplied heat energy, reducing size of the first photoresist pattern and a second photoresist pattern smaller than the first photoresist pattern is finally obtained.

A method of forming a photoresist pattern using a conventional resist flow process is illustrated in FIGS. 1a–1d. As shown in FIG. 1a, a photoresist film 12 is first formed on a semiconductor substrate 22. The photoresist film 12 is exposed using a mask 10 with uniform patterns a, b and c that are subsequently developed. In the case of a positive photoresist, the exposed regions 14 of the photoresist film 12 are removed while the unexposed regions 16 of the photoresist film 12 remain. As a result, a first photoresist pattern 18 is obtained, having the same size of patterns (a=b=c), as shown in FIG. 1b.

Thereafter, as shown in FIG. 1c, the semiconductor substrate 22, with the first photoresist pattern 18 formed thereon, is put into the hot plate oven 100. Photoresist is then flowed by heating the first photoresist pattern over the glass transition temperature. And, the supplied heat energy generates a force F1 which reduces the size of pattern. Therefore, the size of the first photoresist pattern 18 is increased and the size of the gaps is then reduced by the force F1. A second photoresist pattern 20 is finally obtained (see FIG. 1d with smaller gaps a', b', c'), which requires an integrated process.

However, as shown in FIG. 1c, the above-described conventional hot plate oven 100 comprises a hot plate 102, a gas inlet 104 and a gas vent 106. During the resist flow process using this hot plate oven 100, the flow X of gas is then generated since gas is injected via gas inlets 104 and exhausted via a gas vent 106 thereby increasing non-uniformity of the bake temperature. As a result, the instability of the process increases because the sizes of the second photoresist patterns 20 are not uniform.

As shown in FIG. 1d, the size of the gaps a', b', c' of the second photoresist pattern is smaller than the size of the gaps a, b, c of the first photoresist pattern 18 and the pages a', b', c' are not uniform (a'≠b'≠c').

FIG. 2 is a graph illustrating the size change of photoresist pattern as a function of the bake temperature during a resist flow process using a conventional hot plate oven. As shown in FIG. 2, as the temperature goes up, the size of photoresist pattern is drastically reduced. Accordingly, it is difficult to keep the size of the patterns over 50 nm when the baking temperature exceeds 130° C.

SUMMARY OF THE DISCLOSURE

To solve the above-described problem, a hot plate oven is disclosed which has a unique structure used in forming a photoresist pattern. More particularly, a hot plate oven is disclosed which prevents the patterns from overflowing and allows the size of pattern to be identical during the resist flow process, by flowing photoresist under the high pressure in the sealed oven.

A method of forming an ultrafine photoresist pattern and a semiconductor device is disclosed which uses the hot plate oven disclosed herein.

BRIEF DESCRIPTION OF THE DRAWINGS

The disclosed hot plate oven, methods of manufacture and semiconductor devices will be explained in terms of exemplary embodiments described in detail with reference to the accompanying drawings, which are given only by way of illustration and thus are not limitative of the disclosure, wherein.

DETAILED DESCRIPTION OF THE PRESENTLY PREFERRED EMBODIMENTS

Figure 1A:
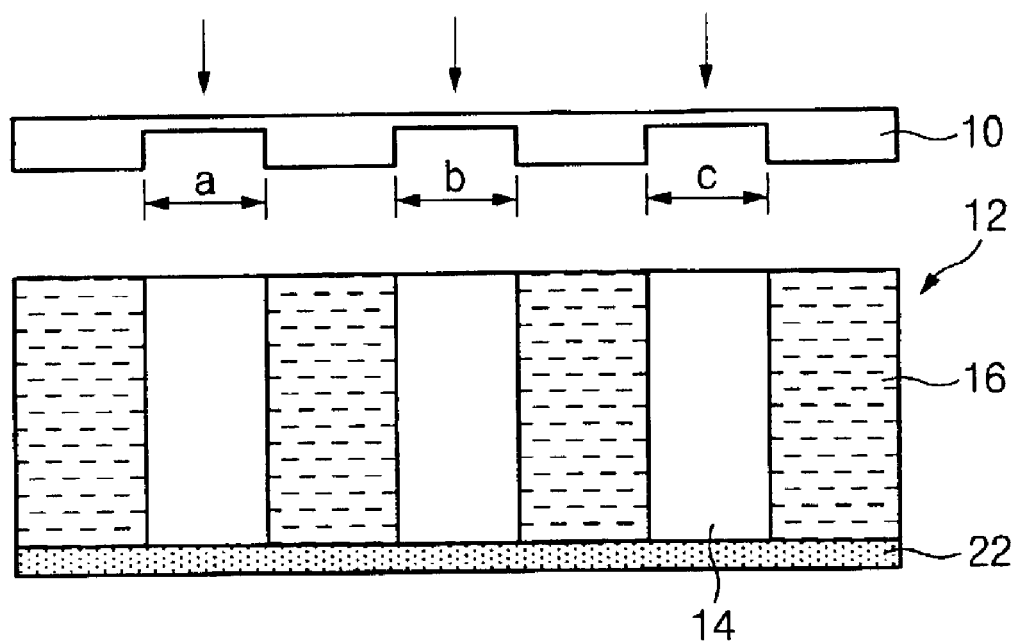
FIGS. 1a through 1d are diagrams illustrating methods of performing a resist flow process using a conventional hot plate oven.
Figure 1B:
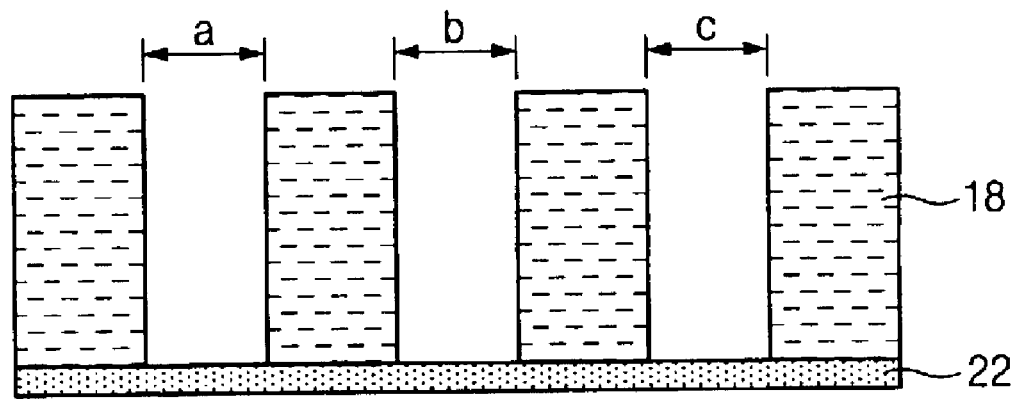
Figure 1C:
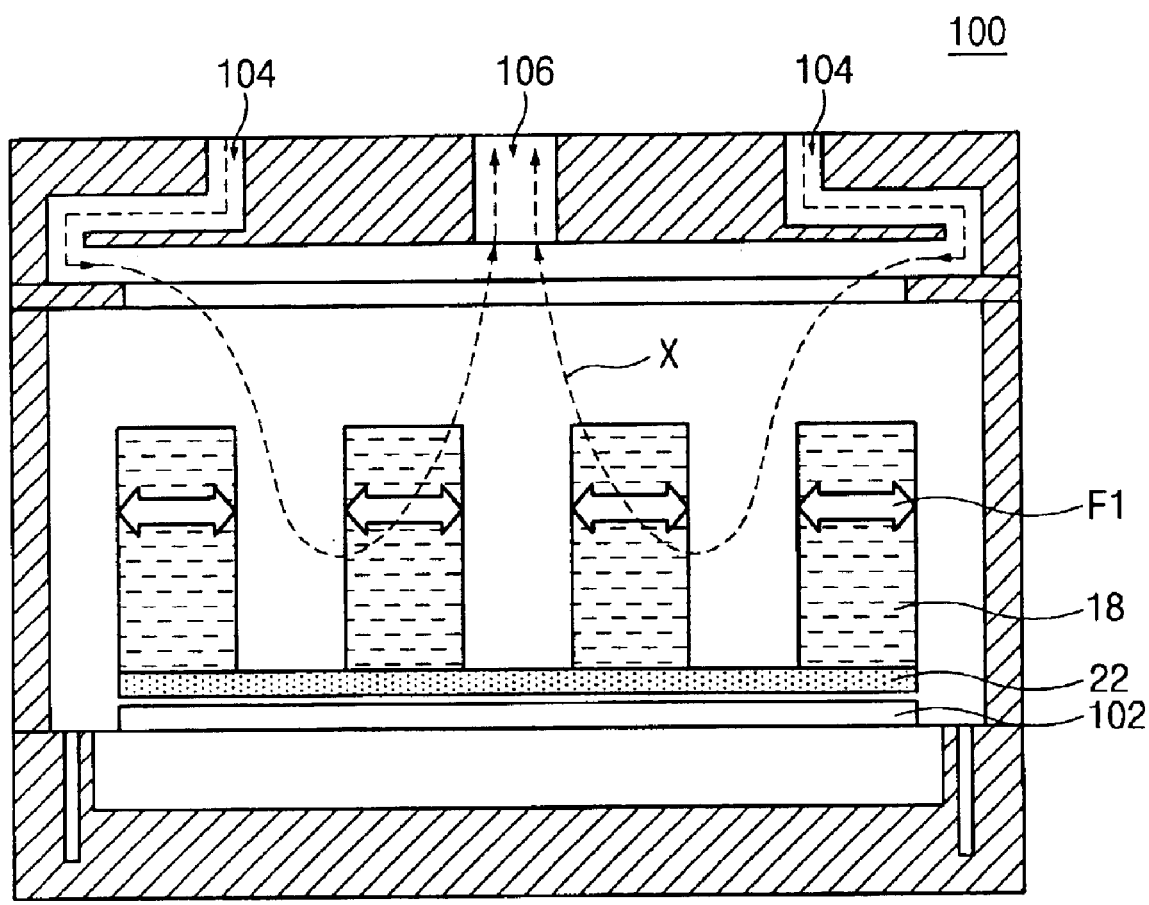
Figure 1D:
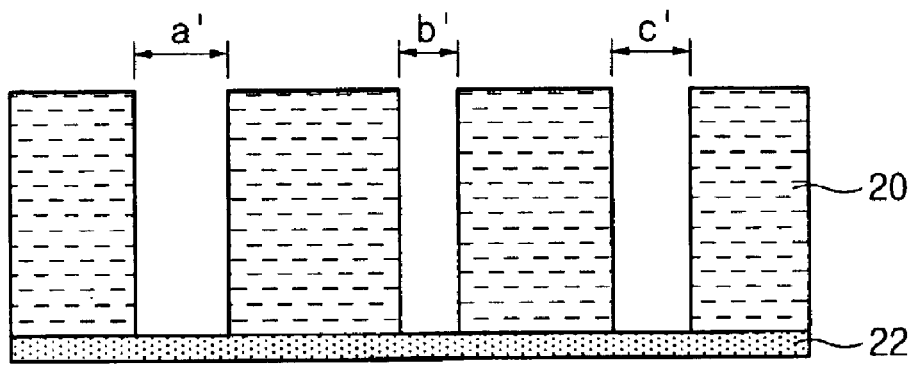
Figure 2:
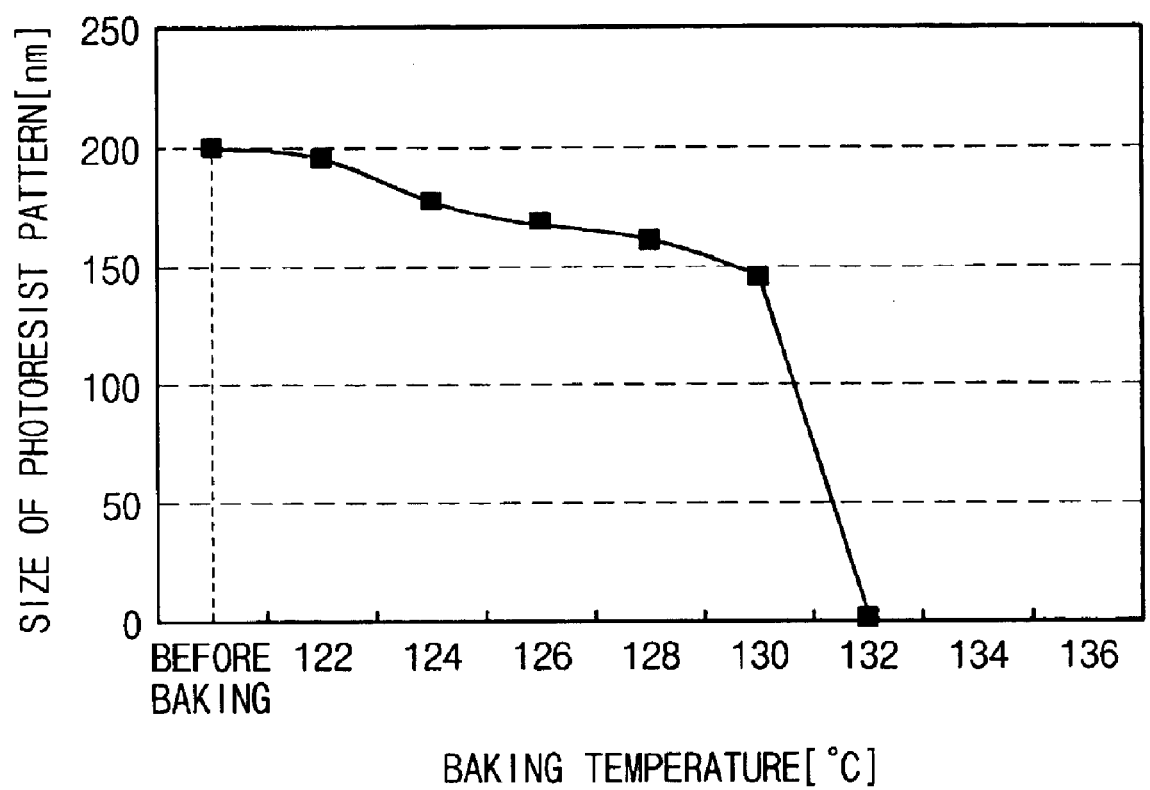
FIG. 2 is a graph illustrating the size change of photoresist patterns according to the bake temperature during the resist flow process using a conventional hot plate oven.
Figure 3A:
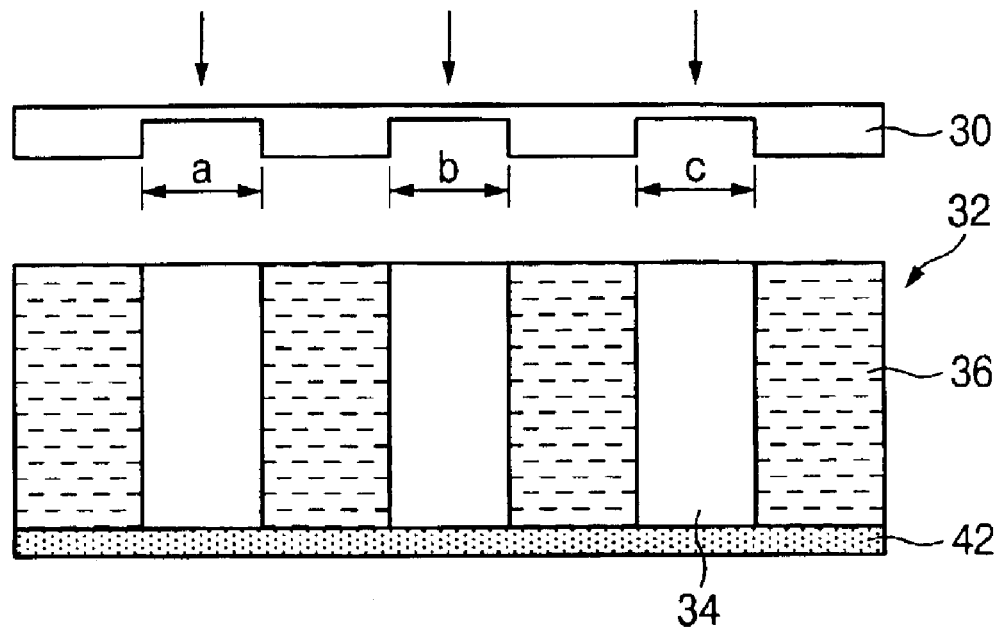
FIGS. 3a through 3e are diagrams illustrating methods of performing a resist flow process using a hot plate oven in accordance with the disclosure.
Figure 3B:
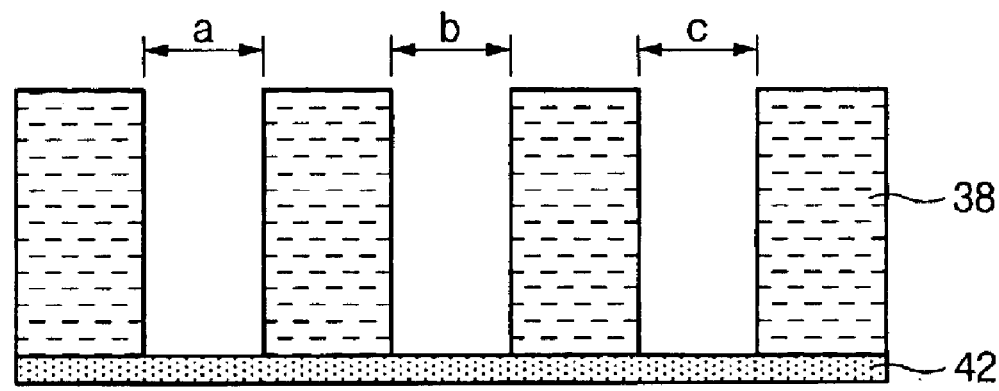
Figure 3C:
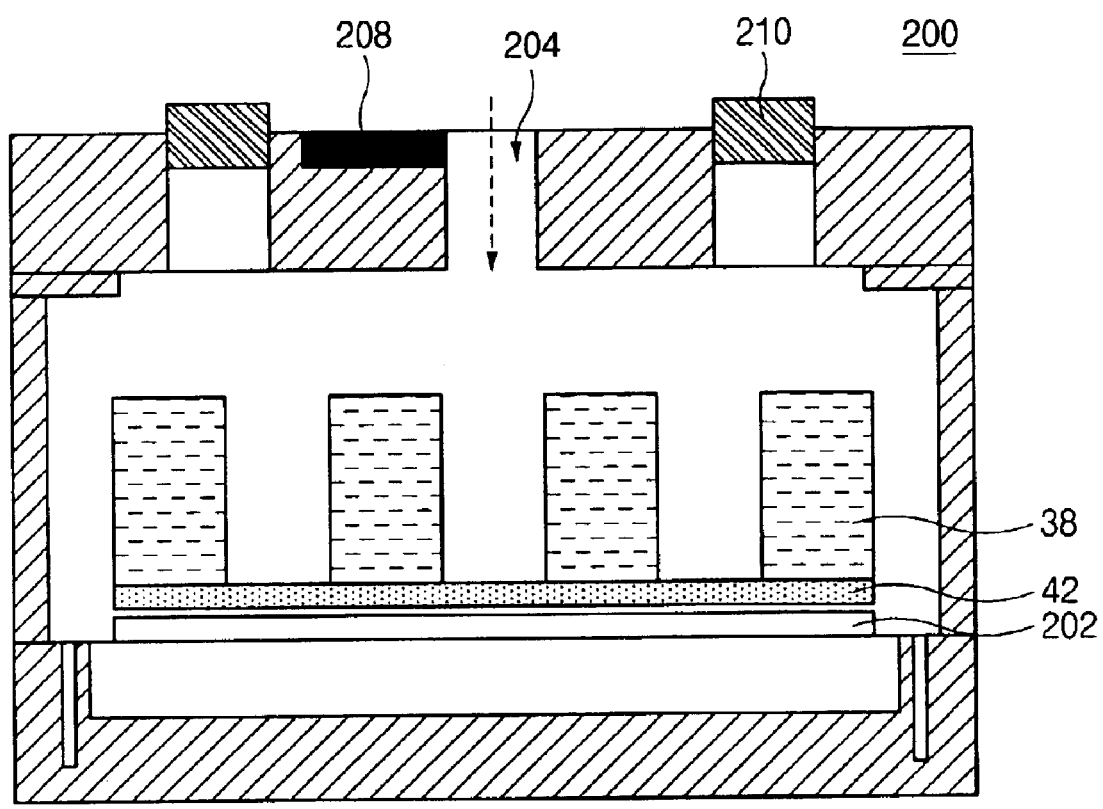

To solve the photoresist pattern size variance problem illustrated in FIG. 1d, a hot plate oven 200 is disclosed which comprises a hot plate 202, a gas inlet/vent member 204, a gas inlet/vent closing member 208 and a pressuring member 210, as shown in FIG. 3c.

The hot plate oven 200 comprises a gas inlet/vent member 204 which is used for both injecting and exhausting gas, whereas the conventional hot plate oven 100 is comprised of gas inlet 104 and gas vent 106 respectively. The hot plate oven 200 further comprises a gas inlet/vent closing member 208 and a pressuring member 210 (see FIG. 3c).

As discussed above, in a conventional hot plate oven 100, air flow X is generated because gas is injected and exhausted through the two separate gas inlets 104 and the gas vent 106. However, the hot plate oven 200 further comprises gas inlet/vent closing member 208 and pressuring member 210 for this process. Therefore, the air flow X is not generated in the hot plate oven 200 because gas is injected via one gas inlet/vent member 204 before a resist flow process, and the gas is then exhausted through the same inlet/vent member 204 after the resist flow process.

In the disclosed hot plate oven 200, a gas inlet/vent member 204 may be combined as shown in FIG. 3c, but it may be separately formed (not shown). When the gas inlet/vent member 204 is separately formed, the gas inlet/vent closing member 208 closes them simultaneously to seal the hot plate oven 200.

The process of forming a first photoresist pattern 38 (FIG. 3b) is now explained. As shown in FIG. 3a, a photoresist film 32 is formed on a semiconductor substrate 42. The photoresist film 32 is exposed using a mask 30 where the same size of patterns a, b and c are formed and then developed. The exposed regions 34 of photoresist film 32 are removed while the unexposed regions 36 of the photoresist film 32 remain. As a result, a first photoresist pattern 38 is obtained, having the same size of patterns (a=b=c), as shown in FIG. 3b.

The first photoresist pattern 38 thus obtained is flowed in the hot plate oven 200. The process of flowing the first photoresist pattern includes:

(a) placing a semiconductor substrate 42 into the hot plate oven 200; (b) injecting inert gas into the hot plate oven through the gas inlet/vent member 204; (c) sealing the hot plate oven 200 by closing the gas inlet/vent member 204 using the gas inlet/vent closing member 208; (d) applying predetermined pressure inside of the oven 200 using the pressuring member 210; and (e) heating the oven 200 to perform a photoresist flow process.

The steps (d) and (e) may be simultaneously or sequentially performed.

Figure 3D:
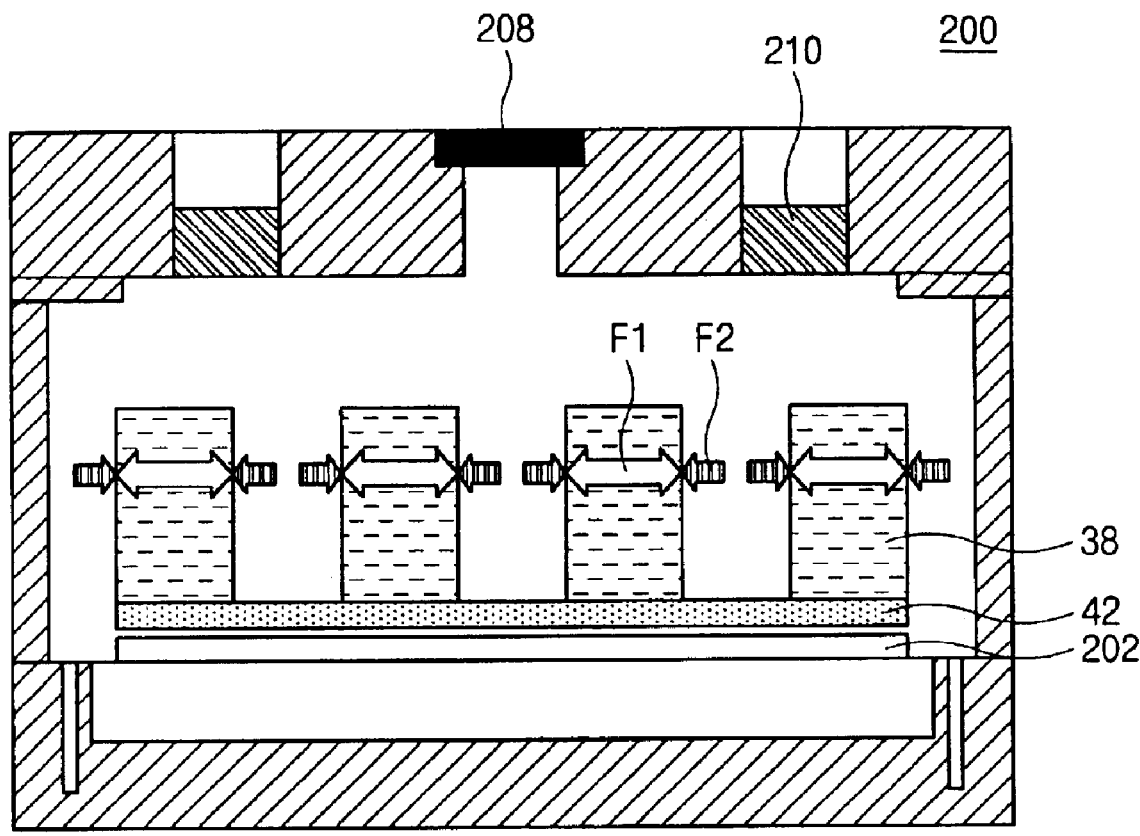

As shown in FIGS. 3c and 3d, the semiconductor substrate 42, whereon the first photoresist pattern 38 is formed, is located at a hot plate oven 200. After inert gas is injected via the gas inlet/vent member 204, the gas inlet/vent closing member 208 closes the gas inlet/vent member 204 and then seals the hot plate oven 200. And the pressuring member 210 pressurizes the hot plate oven 200, thereby creating a high-pressure atmosphere in the hot plate oven 200.

Thereafter, the temperature of a hot plate 202 is raised to over glass transition temperature. A resist flow process is performed on the first photoresist pattern 38 for a predetermined time. After the gas inlet/vent closing member 208 is opened, gas in the hot plate oven 200 is exhausted via the gas inlet/vent member 204. A second photoresist pattern 40 is finally formed with second uniform gaps a', b', c' (FIG. 3e), having smaller sizes than the first photoresist pattern gaps a, b and c (FIG. 3b).

Here, gas injected through the gas inlet/vent member 204 is inert gas such as He, Ne, Ar, $N_2$ or the mixture thereof. The hot plate oven 200 pressured and heated has an internal pressure ranging from about 1 to about 50 atm and an internal temperature ranging from about 100 to about 250° C. It takes a time period ranging from about 10 to about 300 seconds to flow the photoresist patterns.

The hot plate oven 200 utilizes Pascal's principle. According to the Pascal's principle, if pressure is externally applied to an enclosed static fluid, the pressure is transmitted undiminished to all parts of the enclosed fluid.

Figure 4:
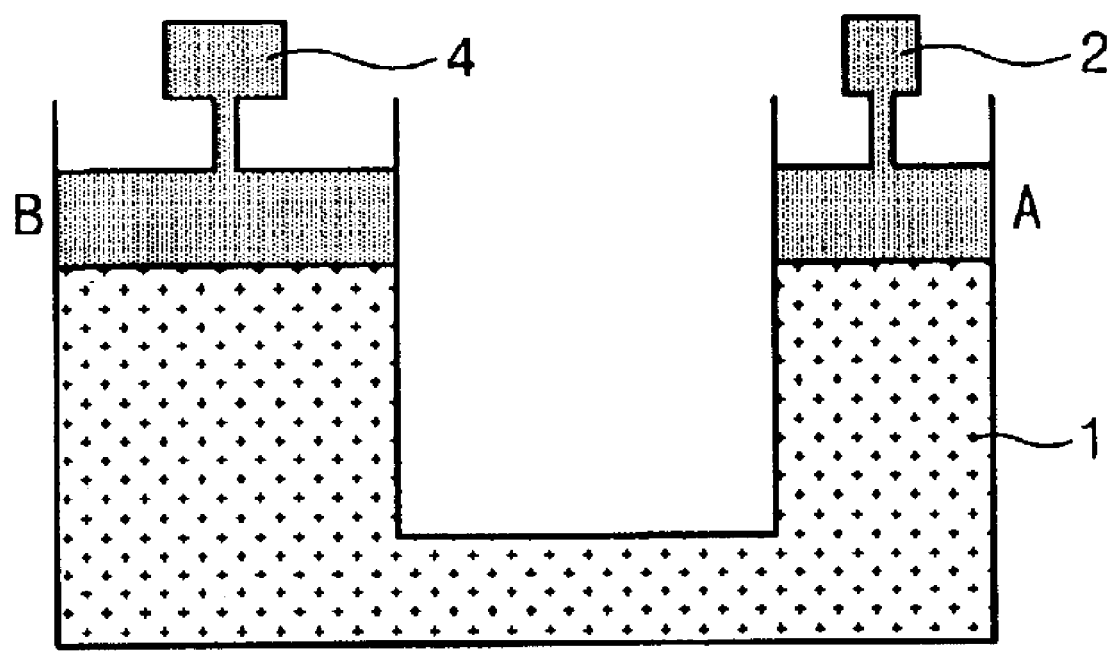
FIG. 4 illustrates Pascal's principle.

As shown in FIG. 4, pressure applied to a fluid 1 by a piston 2 is transmitted to the fluid 1. For example, if a cross sectional area of a piston 4 is x times larger than that of the piston 2, force supplied to B is x times of pressure applied to A.

The hot plate oven 200 is sealed by closing the gas inlet/vent member 204 using the gas inlet/vent closing member 208. Then, the inside of the hot plate oven 200 is pressurized using the pressuring member 210. As a result, force F2 is generated to depress force F1 which reduces the size of the first photoresist patterns, as shown in FIG. 3d. The force F2 is transmitted undiminished to the inside of the hot plate oven 200 according to the Pascal's principle.

Figure 3E:
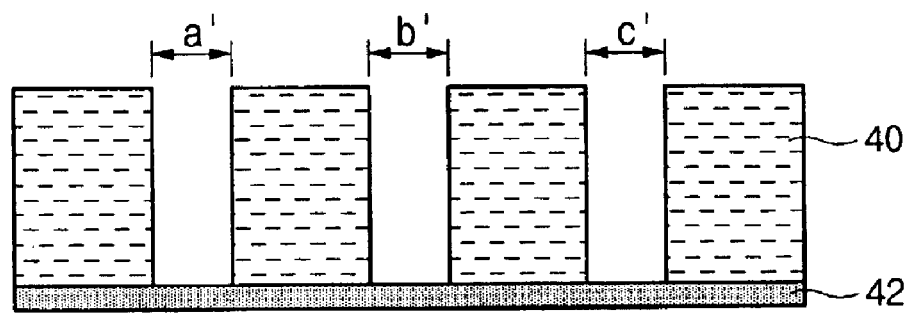

As shown in FIG. 3e, a second photoresist pattern 40 is obtained having a smaller size than that of the first photoresist patterns a, b and c. The second photoresist patterns has the same size a', b' and c' (a'=b'=c').

Figure 5:
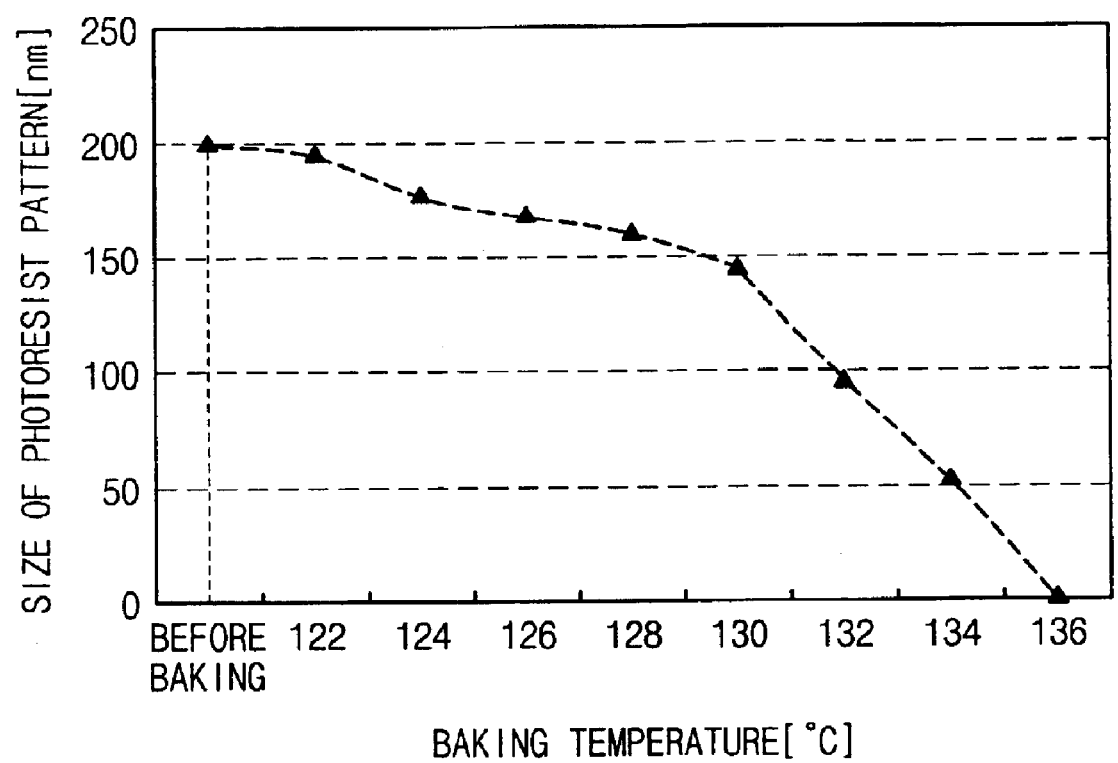
FIG. 5 is a graph illustrating the size change of photoresist patterns according to the bake temperature during the resist flow process using a disclosed hot plate oven.

FIG. 5 is a graph illustrating the size change of photoresist patterns according to the bake temperature during a resist flow process using a hot plate oven in accordance with the present invention. As shown in FIG. 5, the graph shows a gentle slope which means the resist flow process is performed without overflow.

As described earlier, the hot plate oven 200 is used to all the thermal process including baking process to form a photoresist pattern as well as a resist flow process to form an ultrafine photoresist pattern.

In addition, there is provided a method of forming a photoresist pattern during a resist flow using the hot plate oven.

The method comprises:

(a) performing lithography process to obtain a first photoresist pattern; and (b) performing a resist flow process on the first photoresist pattern, using the hot plate oven comprising a gas inlet/vent member and a gas inlet/vent closing member and a pressuring member to obtain a second smaller, but uniform, photoresist pattern.

The method is characterized in that the photoresist can be flowed under the high pressure by sealing the hot plate oven, in the step (b).

Here, the first and the second photoresist patterns may be L/S patterns or contact hole patterns.

Accordingly, the hot plate oven 200 can prevent the patterns from overflowing and obtain an ultrafine photoresist pattern having the same size of patterns, by comprising the gas inlet/vent closing member and the pressuring member.

In addition, the hot plate oven 200 can be used in all baking processes forming photoresist patterns as well as resist flow processes.

What is claimed is:

1. A hot plate oven comprising:
   a single gas inlet/vent, a gas inlet/vent closing member for closing the single gas inlet/vent so that an inside of the hot plate can be isolated from an outside atmosphere, and a pressuring member for pressurizing the inside of the hot plate oven, the single gas inlet/vent being the only means for injecting and releasing gas from the hot plate oven.

2. The hot plate according to claim 1, wherein the oven is a seal-type oven operated in a sealed state.

3. A method of forming a photoresist pattern comprising:
   (a) performing lithography process to obtain a first photoresist pattern; and
   (b) performing a resist flow process on the first photoresist pattern using the hot plate oven of claim 1 to obtain a second photoresist pattern.

4. The method of according to claim 3, wherein part (b) is performed in a sealed state.

5. A method of forming a photoresist pattern, comprising:
   (a) placing a semiconductor substrate into the hot plate oven of claim 1;
   (b) injecting inert gas into the hot plate oven through the gas inlet/vent member;
   (c) sealing the hot plate oven by closing the gas inlet/vent member using the gas inlet/vent closing member;
   (d) applying predetermined pressure to inside of the oven using the pressuring member; and
   (e) heating the oven to perform a photoresist flow process.

6. The method according to claim 5, wherein parts (d) and (e) are performed simultaneously.

7. The method according to claim 5, wherein parts (d) and (e) are performed sequentially.

* * * * *

UNITED STATES PATENT AND TRADEMARK OFFICE
CERTIFICATE OF CORRECTION

PATENT NO. : 6,875,956 B2  
DATED : April 5, 2005  
INVENTOR(S) : Jin S. Kim et al.

Page 1 of 1

It is certified that error appears in the above-identified patent and that said Letters Patent is hereby corrected as shown below:

Column 4,  
Line 32, after "hot" please delete "plate can" and insert -- plate oven can -- in its place.

Signed and Sealed this

Twenty-third Day of August, 2005

JON W. DUDAS  
*Director of the United States Patent and Trademark Office*